United States Patent
Moslehi et al.

(10) Patent No.: US 9,997,389 B2
(45) Date of Patent: *Jun. 12, 2018

(54) BIPOLAR MOBILE ELECTROSTATIC CARRIERS FOR WAFER PROCESSING

(71) Applicant: TESLA, INC., Palo Alto, CA (US)

(72) Inventors: Mehrdad M. Moslehi, Milpitas, CA (US); David Xuan-Qi Wang, Milpitas, CA (US)

(73) Assignee: Tesla, Inc., Palo Alto, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 14/991,772

(22) Filed: Jan. 8, 2016

(65) Prior Publication Data

US 2016/0358802 A1 Dec. 8, 2016

Related U.S. Application Data

(63) Continuation of application No. 13/520,139, filed as application No. PCT/US2010/062614 on Dec. 30, 2010, now Pat. No. 9,330,952.

(Continued)

(51) Int. Cl.
| | |
|---|---|
| *H01T 23/00* | (2006.01) |
| *H01L 21/683* | (2006.01) |
| *G03F 7/20* | (2006.01) |
| *H01L 21/762* | (2006.01) |
| *H01L 21/768* | (2006.01) |
| *H01L 21/02* | (2006.01) |

(Continued)

(52) U.S. Cl.
CPC ...... *H01L 21/6833* (2013.01); *G03F 7/70708* (2013.01); *H01L 21/0217* (2013.01); *H01L 21/02164* (2013.01); *H01L 21/02238* (2013.01); *H01L 21/02255* (2013.01); *H01L 21/02271* (2013.01); *H01L 21/3065* (2013.01); *H01L 21/683* (2013.01); *H01L 21/6831* (2013.01); *H01L 21/76251* (2013.01); *H01L 21/76275* (2013.01); *H01L 21/76281* (2013.01); *H01L 21/76879* (2013.01); *H02N 13/00* (2013.01); *Y02P 80/30* (2015.11)

(58) Field of Classification Search
USPC ................................................. 361/230, 234
See application file for complete search history.

(56) References Cited

U.S. PATENT DOCUMENTS

| | | | |
|---|---|---|---|
| 9,330,952 B2 * | 5/2016 | Moslehi | H01L 21/6833 |
| 2004/0212946 A1 * | 10/2004 | Kellerman | H02N 13/00 361/234 |
| 2005/0029244 A1 * | 2/2005 | Ito | C04B 35/00 219/444.1 |

* cited by examiner

*Primary Examiner* — Danny Nguyen
(74) *Attorney, Agent, or Firm* — Howard IP Law Group

(57) ABSTRACT

In one embodiment, there is provided a carrier comprising a top semiconductor layer having isolated positive electrode regions and isolated negative electrode regions separated by a frontside trench through the top semiconductor layer extending at least to an underlying insulating layer positioned between the top semiconductor layer and a bottom semiconductor layer. A dielectric layer covers the top exposed surfaces of the carrier. Backside trenches through the bottom semiconductor layer extending at least to the insulating layer form isolated backside regions corresponding to the frontside positive and negative electrode regions. Backside contacts positioned on the bottom semiconductor layer and coupled to the positive and negative electrode regions allow for the electric charging of the frontside electrode regions.

20 Claims, 12 Drawing Sheets

Related U.S. Application Data

(60) Provisional application No. 61/291,156, filed on Dec. 30, 2009.

(51) Int. Cl.
    *H01L 21/3065*    (2006.01)
    *H02N 13/00*      (2006.01)

BIPOLAR MOBILE ELECTROSTATIC CARRIERS FOR WAFER PROCESSING

RELATED APPLICATIONS

This application is a continuation of U.S. application Ser. No. 13/520,139 filed Jan. 24, 2013 which is a 371 National Stage of International Application No. PCT/US10/62614 filed on Dec. 30, 2010 which claims the benefit of U.S. Provisional Application No. 61/291,156 filed on Dec. 30, 2009, all of which are hereby incorporated by reference in their entirety.

FIELD OF THE INVENTION

This invention relates in general to the field of thin substrate processing for photovoltaic solar cells, semiconductor microelectronic integrated circuits, micro-electromechanical systems (MEMS), optoelectronic devices (such as light-emitting diodes, lasers, photo detectors), magnetic data storage devices, and more particularly to apparatus, manufacturing and application methods, and systems of mobile and transportable single-wafer and batch electrostatic carriers for holding, supporting, handling, transporting, storing, and processing thin substrates or wafers.

BACKGROUND OF THE INVENTION

Thin and ultra-thin semiconductor substrates, such as semiconductor wafers or foils with a thicknesses in the range of a fraction of micron up to 100 microns, are highly advantageous in many applications including but not limited to high-performance semiconductor microelectronics, system-on-a-chip (SOC), silicon-on-insulator (SOI), MEMS, power electronics, flexible ICs, solar photovoltaics, and optoelectronics.

Further, crystalline (both mono-crystalline and multi-crystalline) silicon (c-Si) wafers are widely used in producing silicon based photovoltaic solar cells, mainly due to higher efficiencies and synergies with the well-established silicon microelectronics industry infrastructure and supply chain. The trend in the mainstream c-Si wafer solar cell industry has been to scale down wafer thicknesses to below 200 microns in order to reduce the amount of silicon material in grams used per watt of solar cell rated peak power—thus reducing the overall manufacturing cost of the solar photovoltaic power modules. For example, the leading edge monocrystalline silicon wafer solar cells are projected to scale down to a wafer thickness of about 120 microns by 2012, from a current wafer thickness of 140 to 200 microns. Technologies are also being developed that use less than 100 microns (μm) c-Si foil (such as foils in the thickness range of a few microns to below 50 microns) to make cost-reduced high efficiency solar cells. In addition, thin semiconductor substrates or foils may be a requirement to make partially see-through c-Si solar cells for building integrated photovoltaic (BIPV) products.

However, thin c-Si solar cells are usually much larger than other stand-alone thin semiconductor or MEMS devices (chips): over 200 to 500 $cm^2$ for solar cells vs. less than 1 to several $cm^2$ for semiconductor microelectronic and MEMS chips. Typical silicon solar cell sizes are 210 mm×210 mm, 156 mm×156 mm, and 125 mm×125 mm squares (or pseudo squares).

Semiconductor wafers, such as monocrystalline silicon wafers are quite brittle and break easily from stresses, micro-cracks, and edge damage when their thickness is reduced—particularly to much less than 150 microns. In addition, because of the reduced mechanical rigidity of a thin wafer it becomes more flexible and behaves more like a flexible piece of thin foil. As a result, it is rather difficult and problematic (in terms of mechanical yield) to handle and process these thin wafers in normal automated semiconductor microelectronic or photovoltaic process equipment and fabs that are designed to process and handle wafers with regular thicknesses (e.g., ~150 microns to ~1000 microns).

In order to use existing commercially-available wafer processing equipment and fab automation solutions for thin wafer handling and processing, mobile chucks or carriers have been developed to support and hold thin wafers and substrates in place during handling and processing. Using these carriers, the bonding of the thin wafer and the carrier may be made either temporary or permanent. Many current thin wafer bonding techniques are too expensive and cumbersome (e.g., bonding and de-bonding steps take too long and use expensive materials and/or processes) to be used for mass production of low-cost solar cells.

Current mobile electrostatic carriers (MESC) have been developed to utilizing electrostatic force between two electrodes to hold the thin wafers. Generally, there are two types of MESCs: a unipolar (monopolar) type and a bipolar type. FIGS. 1A (prior art) and 1B (prior art) are cross-sectional schematic drawings of current designs of a unipolar MESC and a bipolar MESC, respectively. Unipolar MESCs consists of an electrode layer embedded in a dielectric material, shown the electrode extends along the entire lateral plane of the MESC. In this configuration the thin wafer to be clamped forms the second electrode of the capacitor, which means the thin wafer surface has to be electrically contacted for charging/clamping and discharging/declamping. As shown in FIG. 1A, unipolar MESC 10 comprises metal (or electrically conductive material) base-plate 12 under thin dielectric layer 14. The metal (or electrically conductive material) base-plate is maintained at a high-voltage relative to thin wafer 16 sitting on top of the thin dielectric layer to create an electrostatic force which clamps the thin wafer to it. In other words, the thin wafer serves as one of the two capacitor electrodes—the other being the base-plate—when a high voltage is applied to activate the chucking and when the MESC is discharged.

Unipolar MESCs are often made from the same material as the thin wafer to minimize or eliminate the coefficient of thermal expansion (CTE) mismatch during thermal process. The advantage of such a unipolar MESC is its simplicity, however when a dielectric layer or a thick non-conductive reinforcement layer is applied onto the thin wafer front surface, it is difficult to discharge the capacitor in order to separate the thin wafer from the MESC since there is no conductive path access to the thin wafer (particularly if the thin wafer goes through a dielectric deposition process such as deposition of a PECVD silicon nitride passivation/ARC layer in a silicon solar cell).

Current bipolar MESCs consist of two electrodes embedded and laterally insulated in a dielectric material. In contrast to a unipolar MESC, the thin wafer does not need to be electrically contacted for charging and discharging because the capacitor is formed between the two electrodes or multiple pairs of electrodes. Such a bipolar MESC is usually made from metal electrodes and polymer dielectric layers; therefore it is limited in terms of thin wafer thermal process and wet chemical process capabilities. As shown in FIG. 1B, bipolar MESC 20 has both of electrodes of opposite polarity (negative electrodes 22 and positive electrodes 28) embedded under dielectric layer 24 and in the MESC itself. This bipolar MESC design relies upon the electric field generated between the two electrodes to hold thin wafer 26 in place. When using a bipolar MESC, during the chucking and dechucking, the thin wafer does not need to be electrically contacted.

Current bipolar mobile electrostatic carriers are often made from metallic electrodes and polymer dielectric layers, because of which the overall performance of the MESCs is limited with some of the following concerns:

(1) The existence of metal and polymer limits the thin wafer processing temperature to be typically less than 300° C., which means that current MESCs cannot be reliably used for wafer processing much above 300° C.;
(2) The thin wafer and processing equipment may be contaminated by the MESC structural materials, especially when processed at elevated temperatures;
(3) The thermal (TCE) mismatch between the MESC structural materials (metal & polymer) and the thin semiconductor wafer may cause warpage or even breakage of the thin wafer (and/or formation of microcracks);
(4) The MESC structural materials (metal & polymer) may not be chemically compatible with commonly used dry and wet chemical etching and deposition processes;
(5) The overall mobile electrostatic carrier lifetime may be affected by the dielectric qualities of the polymer dielectric materials, especially in wet environments; and
(6) De-clamping of thin wafer from the MESC may be difficult and take a long time (particularly after high-temperature processing) due to the charging of the MESC capacitor dielectric.

SUMMARY OF THE INVENTION

In accordance with the disclosed subject matter, innovative structures and methods for manufacturing bipolar mobile electrostatic carrier for thin wafer processing are provided.

In one embodiment, there is provided a carrier comprising a top semiconductor layer having isolated positive electrode and negative electrode regions separated by a frontside trench through the top semiconductor layer extending at least to an underlying insulating layer positioned between the top semiconductor layer and a bottom semiconductor layer. A dielectric layer covers the top exposed surfaces of the carrier. Backside trenches through the bottom semiconductor layer extending at least to the insulating layer form isolated backside regions corresponding to the frontside positive and negative electrode regions. Backside contacts positioned on the bottom semiconductor layer and coupled to the positive and negative electrode regions allow for the electric charging of the frontside electrode regions.

The disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages included within this description, be within the scope of the accompanying claims.

BRIEF DESCRIPTION OF THE DRAWINGS

For a more complete understanding of the disclosed subject matter and advantages thereof, reference is now made to the following description taken in conjunction with the accompanying drawings in which like reference numbers indicate like features and wherein.

DETAILED DESCRIPTION OF THE SPECIFIC EMBODIMENTS

Figure 1A:
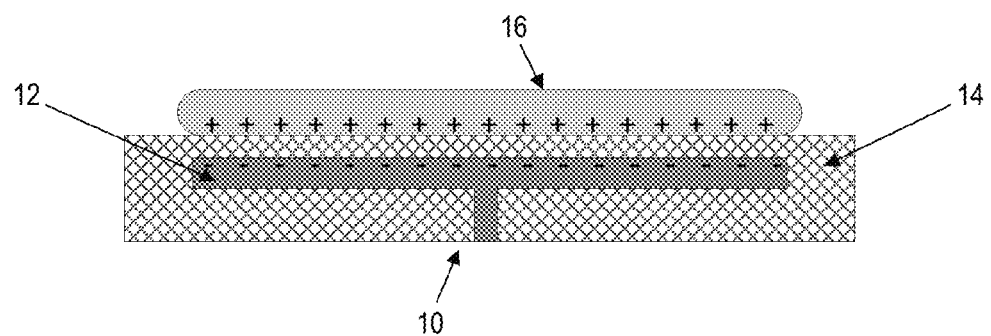
FIGS. 1A (prior art) and 1B (prior art) are cross-sectional schematic drawings of current designs of a unipolar MESC and a bipolar MESC.
Figure 1B:
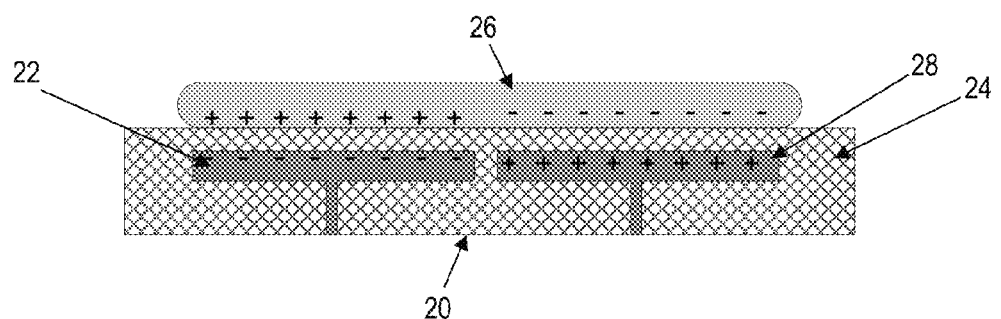

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like numbers being used to refer to like and corresponding parts of the various drawings. And although described with reference to silicon, other semiconductor materials such as germanium or gallium arsenide may also be used without departing from the scope of the disclosed structures and methods.

This application provides designs and manufacturing methods of Mobile-Electrostatic-Carriers (MESC) for supporting, handling, transporting, storing, and processing thin and fragile semiconductor wafers—and more specifically for semiconductor substrates or wafers with substrate thicknesses in the range of about a fraction of one micron or less to over 100 microns, with substrate areas as large as 100's or even 1000's of $cm^2$—thereby enabling both manual and automated wafer processing in various applications such as semiconductor microelectronics and solar photovoltaics fabs. Such Mobile ElectroStatic Carriers (MESC) enable ultrathin wafer processing (i.e., supporting, handling, transporting, processing, storing, etc.) while ensuring substantially reduced mechanical yield losses due to thin substrate breakage. The MESCs disclosed and methods for manufacturing, are high-performance bipolar MESCs that may be suitable for making low-cost photovoltaic solar cells and may be applied in a wide range of other applications including making solar photovoltaic cells, semiconductor microelectronic chips, system-on-a-chip (SOC), MEMS devices, discrete devices, power electronics, flexible ICs, data storage devices, optoelectronic devices (e.g., LEDs, lasers, photo detectors), and other high-technology products using monolithic integrated manufacturing technologies.

In one embodiment, the bipolar MESC of the present disclosure has multiple pairs of electrodes made of doped crystalline silicon (preferably doped mono-crystalline silicon) that sit on a silicon substrate with an underlying silicon dioxide (preferably thermally grown silicon dioxide) insulating layer in between the crystalline silicon and the silicon substrate. The exposed surfaces of the silicon electrodes are insulated and coated by dielectric layers which may be made of thermally grown silicon dioxide and low-pressure chemical-vapor-deposited (LPCVD) silicon nitride. Isolation trenches are formed in the backside silicon substrate and electrical contacts for charging and discharging are formed by backside hole/via contacts. A suitable electrically conductive material, such as Al, Ag, or a chemically inert (chemical resistant) metal alloy is selectively coated within the electrical contact holes on the MESC backside.

Further, manufacturing methods for improved higher performance bipolar MESCs in accordance with the disclosed subject matter are provided. These methods may use a pair of bonded (such as fusion bonded) silicon (such as monocrystalline silicon) wafers or an silicon-on-insulator (SOI) wafer with optimal silicon and insulating layer (e.g. silicon dioxide) thicknesses, forming the MESC electrode isolation trenches (on both the top and bottom electrodes) and backside contact holes by one or a combination of techniques including DRIE silicon etching, wet silicon etching, or direct laser cutting/drilling. The exposed silicon surfaces are coated, preferably with high-quality thermally grown silicon dioxide and low-pressure chemical-vapor-deposited (LPCVD) silicon nitride. MESC electrical contacts are formed by applying (depositing) an electrically conductive material (such as a chemical resistance and/or high-temperature-capable metal or metal alloy) within the backside contact holes. Optionally, dependent on the MESC electrode contact material used, if the main MESC electrode contact material is not chemical resistant a corrosion resistant/chemical resistant material (e.g., Hastelloy or titanium nitride) may be used as a final coating applied within the backside contact holes.

The disclosed MESC may be about the same size or slightly larger (to protect the thin substrate edges) than the thin wafer to be bonded, and thicker and substantially more rigid and mechanically stronger than the thin wafer The MESC may be a single wafer mobile carrier or the MESC may be designed and fabricated in a batch tray form that allows multiple-wafer carrying/support for a batch or a hybrid batch/in-line manufacturing process—such as for batch/in-line wet processing (e.g., one-sided wafer etching/texturing) and batch/in-line vacuum PECVD silicon nitride anti-reflection coating (ARC) deposition for solar photovoltaic cell processing applications.

The disclosed bipolar MESC structures and various embodiments provide numerous technical advantages, including but not limited to:
(1) The MESCs structures disclosed made with crystalline silicon wafers used as capacitor electrodes provide excellent CTE (coefficient of thermal expansion) match with the thin silicon wafers to be processed, i.e., there is no thin wafer warpage caused by the MESC itself and the thermal mismatch between the MESC and the thin wafer during thermal processing;
(2) There is no cross contamination from the MESC to the thin wafer because neither polymer nor metal is used to make contact to the thin wafer;
(3) Using bulk silicon instead of metal for capacitor electrodes, and thermally grown silicon dioxide (or a combination of thermally grown silicon dioxide and LPCVD silicon nitride) for a capacitor dielectric provides much higher quality capacitor for reliable electrostatic clamping and declamping events;
(4) The LPCVD silicon nitride overcoat enables high temperature thermal processing (e.g., temperatures as high as 450° C. or even more for reliable clamping and declamping) and many silicon wet chemical processes such as KOH, TMAH and HF etching with negligible loss of LPCVD silicon nitride;
(5) Thermally grown silicon dioxide (particularly thermal oxide grown on a monocrystalline silicon wafer) has negligible charging of the dielectric due to the very high quality and large bandgap/barrier height of thermal silicon dioxide—thus, enabling consistent clamp/declamp performance even at high process temperatures such as up to 450° C. thermal processing;
(6) MESC capacitor with monocrystalline silicon electrodes in conjunction with silicon dioxide and LPCVD silicon nitride capacitor dielectric enables very long charge retention, negligible dielectric charging, and easy and fast thin wafer declamping on demand after the thin wafer fabrication process;
(7) The relatively symmetrical frontside and backside wrap-around dielectric stacks provides balanced stress, therefore, there is not MESC or thin wafer warpage since the oxide and nitride stress effects between the front and back sides are cancelled out; and
(8) The use of ultra-planar MESC surfaces preserves the ultra-planar thin wafer surface during clamping and thin-wafer processing.

Figure 2A:
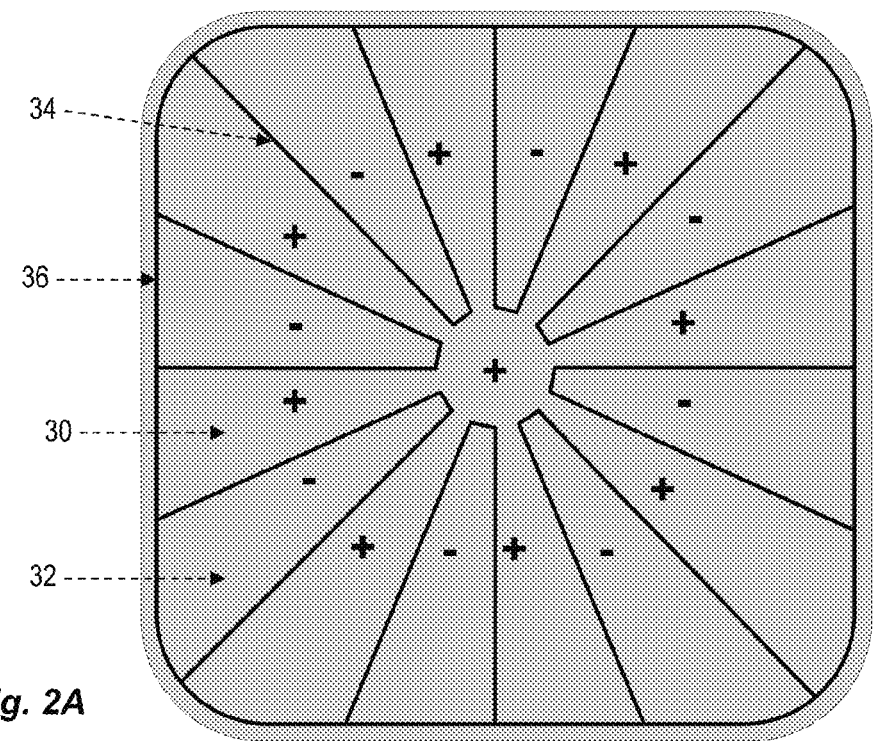
FIGS. 2A and 2B are top and bottom view schematic drawings, respectively, of an embodiment of a bipolar MESC design in accordance with the disclosed subject matter.
Figure 2B:
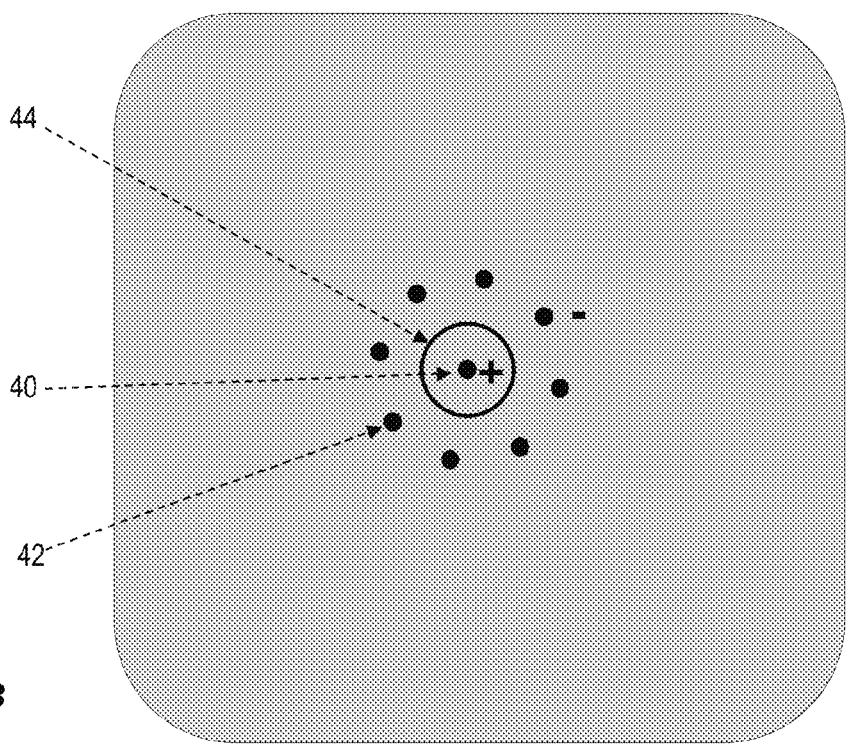

FIGS. 2A and 2B are top and bottom view schematic drawings, respectively, of an embodiment of a bipolar MESC design in accordance with the disclosed subject matter. Bipolar MESC shown in FIGS. 2A and 2B is made of two bonded thick layers of crystalline silicon with a buried/underlying silicon dioxide layer in between. FIG. 2A shows the front, or top, view of the MESC comprising an electrode design of eight electrode pairs (other designs, patterns, and numbers of pairs of electrodes may be used). First polarity electrodes 30 are shown as positive and second polarity electrodes 32 are shown as negative and are evenly and symmetrically arranged in a hub and spoke design with narrow isolation trenches 34 and coated dielectric layers to isolate them. Every isolated negative electrode is surrounded by positive electrodes and continuous boundary trench 36 on the MESC peripheral to electrically isolate the electrode design. All the positive electrodes are connected through the hub at the center of the MESC. Alternatively, the positive electrodes may be isolated and the negative electrodes may be connected at the hub—thus reversing the polarity of electrode regions 30 and 32. This distributed arrangement of electrodes provides uniform electrostatic clamping force that allows the thin wafer to be fully clamped.

FIG. 2B shows the backside, or bottom, view of the eight electrode pairs MESC shown in FIG. 2A. Enclosed backside isolation trench 44 separates the backside silicon into two isolated regions with electrical contact holes; the center region corresponds to the hub region on the front side for connection to the positive electrodes to create positive contact 40. And the outer region corresponds to the isolated islands/regions on the front side for connection to the negative electrodes to create negative contact 42 (note: the voltage polarity may be reversed). The electrical contact holes, shown as positive contact 40 and negative contact 44 are etched through the buried silicon oxide layer between the top and bottom silicon layer and they are coated or filled with inert metal layers for making direct electrical contact to the front silicon electrodes from the backside.

Figure 3A:
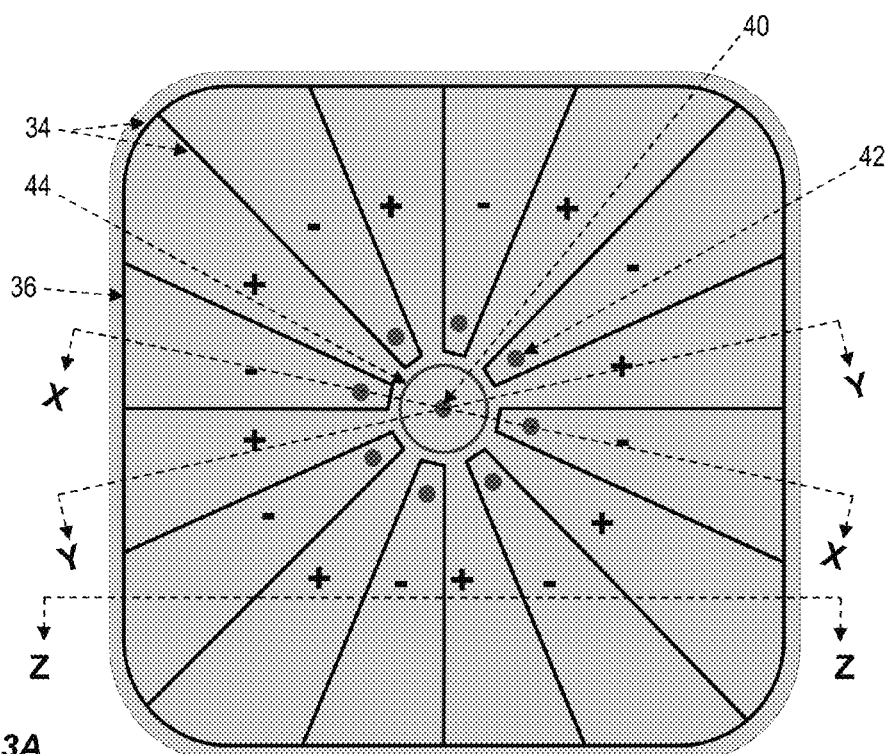
FIG. 3A is a schematic drawing of FIGS. 2A and 2B overlapped together to show the alignment of the frontside and backside features.

FIG. 3A is a schematic drawing of FIGS. 2A and 2B overlapped together to show the alignment of the frontside and backside features: frontside isolation trenches 34, frontside continuous boundary trench 36, backside isolation trench 44, backside positive contact 40, and backside negative contact 44. FIG. 3A shows the front and back side trench and contact hole patterns in one overlapped view in order to illustrate the alignment of the features. It may be seen the backside center contact makes connection to all the positive silicon electrodes on the frontside while each backside outer contact hole makes electrical connection only to the corresponding isolated negative silicon electrode on the frontside. The backside outer contact holes connect the frontside negative electrodes in parallel. Therefore, during charging and discharging only one of the negative contacts on the backside needs to be electrically contacted by the charge/discharge unit since all negative contacts are connected in parallel.

Figure 3B:
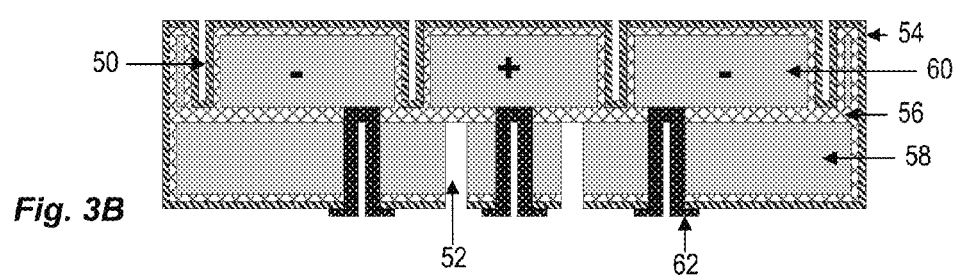
FIGS. 3B, 3C, and 3D are cross sectional diagrams of the MESC of FIGS. 2A, 2B, and 3A.
Figure 3C:
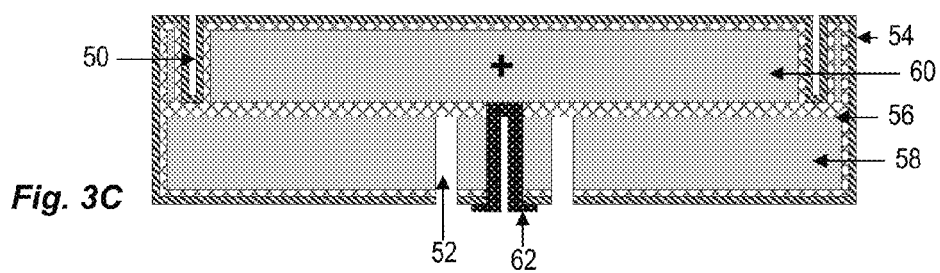
Figure 3D:
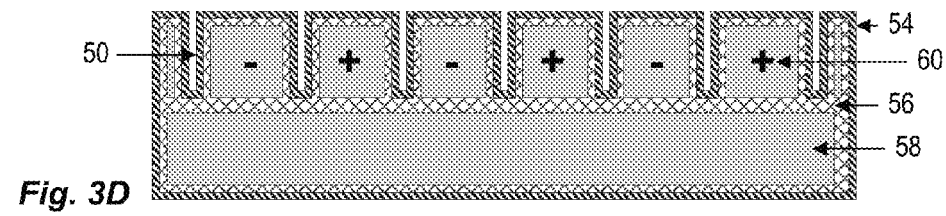

FIGS. 3B, 3C, and 3D are cross sectional diagrams of the MESC of FIGS. 2A, 2B, and 3A along the X-X, Y-Y, and Z-Z planes depicted in FIG. 3A. The structural features depicted in the cross section diagrams of FIGS. 3B, 3C, and 3D are consistent unless otherwise noted.

FIG. 3B is a cross sectional diagram of the MESC of FIG. 3A along the X-X cross-sectional plane. The MESC may be formed of two bonded mono-crystalline silicon wafers or an SOI wafer. The MESC comprises top silicon layer 60, bottom silicon layer 58, insulating layer 56 (which may be $SiO_2$), dielectric layer 54 (which may be LPCVD $SiN_x$), backside contacts 62, backside isolation trench 52, and frontside isolation trench 50. As shown in FIG. 3B, front isolation trenches have an optional continuous boundary trench which is formed to physically isolate the MESC edge from the isolation trenches so that the frontside isolation trenches do not extend all the way to the MESC edge thus preventing gas or liquid diffusion into the trenches during dry or wet thin wafer processing. In this embodiment, the frontside (main clamp side) trenches completely cut through the top silicon wafer for complete electrical isolation and have their trench bottoms terminated preferably at the buried oxide layer, or if necessary, in near the top of the bottom silicon wafer. The top silicon wafer surfaces, including its top surface, side surface, and trench sidewall and bottom surfaces are all covered with a relatively thick dielectric layer—for example a thermally grown silicon dioxide layer (1 µm to 2 µm thick) and an LPCVD silicon nitride layer (0.5 µm to 3 µm thick). As a result, the silicon regions that are separated by the frontside trenches are fully electrically isolated, thus forming isolated silicon electrodes (a positive electrode in the center and isolated negative electrode shown on the sides in this design). The MESC backside comprises backside isolation trenches and metalized backside contact holes on the bottom silicon wafer. The bottom wafer backside surface and edge surfaces are also covered by the same dielectric layer—thermal oxide and LPCVD nitride layers—which may be formed during the same process steps as for the frontside layers. The backside contact holes may be drilled through the backside wafer and also through the buried oxide layer in order to reach the front side isolated silicon regions (the bottom of the top silicon wafer electrodes). Metal layers are then selectively deposited into the backside holes and reach all the way to their bottoms. As a result, the front side isolated silicon electrodes may be electrically connected from the isolated through-silicon-via (TSV) contacts on the backside. The backside contact holes may or may not be fully filled by the metal material. The backside isolation trenches are formed to isolate the positive and negative backside contact holes and the formation of the backside isolation trenches preferably terminates at the buried insulating layer (such as an oxide layer) to eliminate the possibility that the backside silicon electrically connects to the frontside silicon in the backside isolation trenches by particles or electrolyte in the backside isolation trenches. The sidewalls of the backside isolation trenches are also coated with insulating layers during the same dielectric layer formation steps (e.g. thermal oxidation and LPCVD silicon nitride process steps) used for isolation of the frontside trench sidewalls.

FIG. 3C is a cross sectional diagram of the MESC of FIG. 3A along the Y-Y cross-sectional plane. Only the positive electrode is shown on the top silicon wafer with the center/positive backside contact hole shown on the bottom silicon wafer. The silicon region where the positive backside contact hole (backside contact 62) is formed is isolated from the rest of the bottom silicon wafer by the continuous backside isolation trench (backside isolation trench 52). FIG. 3D is a cross sectional diagram of the MESC of FIG. 3A along the Y-Y cross-sectional plane in which interdigitated silicon electrodes are shown on the top silicon wafer. The positive electrodes are connected through the center hub region, and the negative electrodes are isolated and connected together in parallel by the backside contact holes for charging and discharging. The bottom silicon wafer portion shown is the silicon region that connects all the negative backside contact holes. It is to be noted, the positive and negative electrodes in FIGS. 2 through 3 are relative and the polarity may be interchanged.

Figure 4:
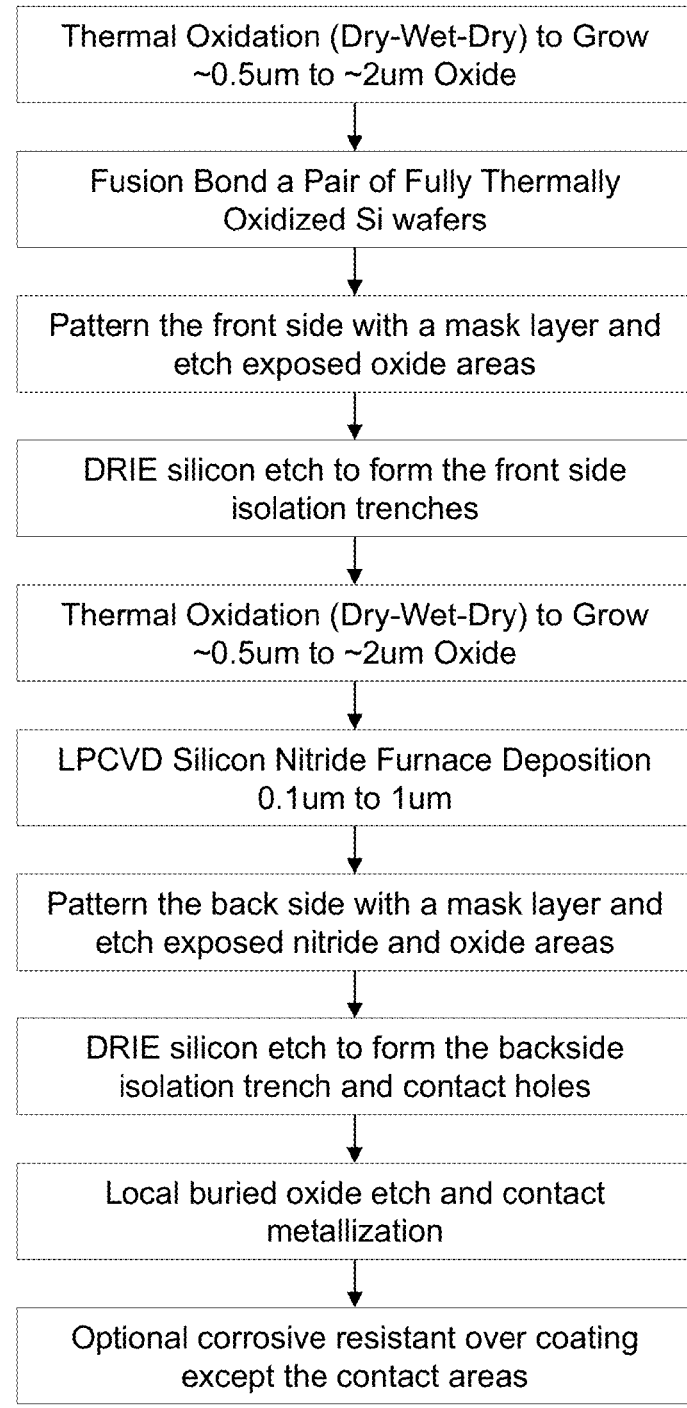
FIG. 4 is fabrication process flow and FIG. 5A through 5F illustrate X-X cross-sectional schematic drawings after key fabrication steps for the formation of the bipolar MESC of FIGS. 2 and 3.

FIG. 4 is fabrication process flow and FIG. 5A through 5F illustrate X-X cross-sectional schematic drawings after key fabrication steps for the formation of the bipolar MESC of FIGS. 2 and 3. The structural features depicted in the cross section diagrams of FIGS. 5A through 5F are consistent unless otherwise noted. In this fabrication process, the isolation trenches and back contact holes are formed by Deep Reactive Ion Etching (DRIE) silicon etch.

Figure 5A:
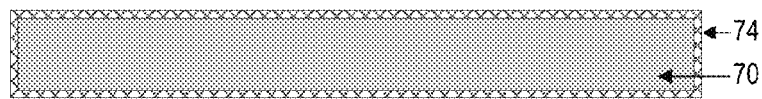

In this embodiment, the fabrication process starts with two mono-crystalline silicon wafers—each wafer thickness preferably in the range of 150 µm up to 1 mm and size (side dimension or diameter) of 100 mm to 300 mm or larger. The wafers may be either n-type or p-type, preferably with relatively low resistivity (e.g., $<\Omega \cdot cm$), much preferably less than 0.1 $\Omega \cdot cm$. The two wafers should be preferably double-side-polished to suppress leakage current and oxide charging although single-side polished wafers may be used if the clamped MESC surface is a polished surface. The fabrication process may also begin with a preformed wafer having an underlying insulating layer between a top silicon layer and a bottom silicon layer. As shown in FIG. 5A, the two silicon wafers (top silicon wafer 70 and bottom silicon wafer 72) are thermally oxidized with silicon oxide layer 74 which is 0.5 μm to 3 μm thick. Optionally one of the two wafers may be oxidized while the other is not. A dry-wet-dry high-temperature (1000° C. to 1200° C.) oxidation process is preferred for improving the overall oxide quality. Then the two cleaned wafers are cleaned by standard pre-oxidation wafer cleaning process, including RCA1, RCA2, and short diluted HF dipping followed by extensive DI water rinsing. The cleaned wafers are then brought into contact and make initial bonding which may be performed in vacuum, in air, or in DI water. The silicon surfaces to be bonded are preferably flat and smooth which may require polishing. The surfaces are also preferably hydrophobic for the ease of initial bonding. Since the initial bonding is based on Van de Wall's force or the like, it is of low bonding strength. In the next step, the initially bonded wafer pair is annealed at an elevated temperature about 1000° C., to form a strong chemical bond between the two wafer surfaces.

Figure 5B:
Figure 5C:
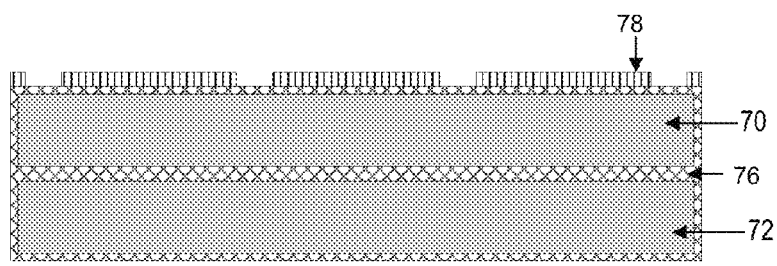
Figure 5D:
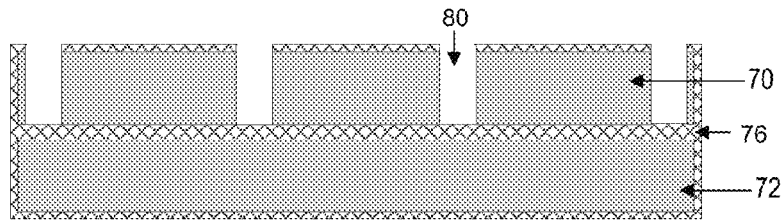

After the fusion bonding and the formation of a wafer having an underlying insulating layer 76 ($SiO_2$) between a top silicon layer and a bottom silicon layer, patterned masking layer 78 is deposited on top of the front surface of the bonded wafer. The patterned masking layer may be a photolithographically defined photoresist layer or a screen printed (or stencil printed or inkjet printed) making layer. The patterned masking layer is used for conducting the subsequent oxide patterning and silicon trench etching. Alternatively, an oxide etch paste layer may be screen printed and sintered for etching the underneath oxide. FIG. 5B shows the bonded wafers with fully covered by the insulating layers (thermal oxide layers) and the patterned masking layer on its top surfaces. Next, the lateral pattern of the masking layer is transferred onto the underneath silicon dioxide layer by a buffered HF (BOE) oxide etching step. The backside and edge oxide surface is protected in the BOE oxide etching step. After the oxide etching, the remaining masking layer is optionally removed and the wafer is cleaned. Next, as shown is FIG. 5C, a DRIE silicon etching process, such as a cryogenic or a Bosch process, is used to etch the narrow and deep (high aspect ratio) silicon frontside trenches 80. The trench width is in the range of 10 μm to 100 μm and the depth is in the range of 10's μm to 500 μm. The DRIE silicon etching is self-terminated or endpointed at the buried silicon dioxide layer. The sidewalls of the etched trenches are preferably smooth and methods, such as short wet silicon etching (with KOH or NaOH) or another thermal oxidation and local oxide wet etch, may be used to increase the surface smoothness and to remove residual damage of the trench sidewalls. Next, as shown is FIG. 5D, a thermal oxide layer of 0.5 μm to 2 μm thick is grown followed by a LPCVD silicon nitride deposition of 0.1 μm to 3 μm thick, shown as dielectric layer 82. After this step, all the exposed silicon surfaces, including the trench sidewalls and wafer edges, are fully covered with the dielectric stack of thermal oxide and LPCVD nitride. Next, the backside LPCVD silicon nitride layer is optionally fully removed in a single-side chemical etching or mechanical lapping process. Next, patterned masking layer 84 is applied on the backside by photolithographically defined photoresist or a screen-printed masking layer. Alternatively, a nitride and oxide etch paste layer may be screen printed and sintered for etching the underneath oxide and nitride layers. The backside patterning is aligned to the front side pattern (etched features) with front and backside alignment marks.

Figure 5E:
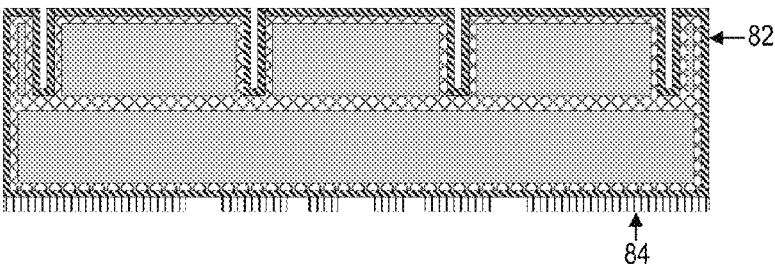
Figure 5F:
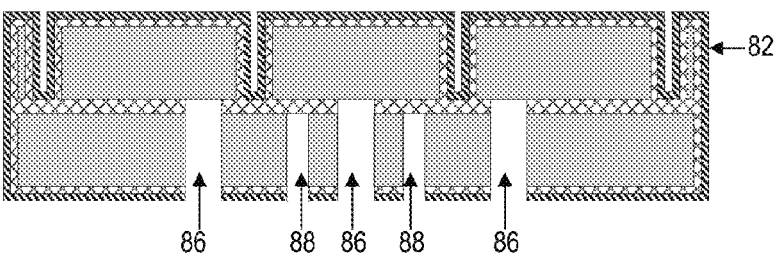

After a subsequent silicon nitride and oxide wet etching, anther DRIE silicon etching process is performed to form the backside isolation trenches and contact holes. The backside DRIE silicon etching is self-terminated when it reaches the buried/underlying oxide layer from the backside. Next, a selective buried silicon oxide etching is performed by dispensing HF based wet etchant into the etched backside contact holes only. The dispensing of the HF based wet etchant is precisely controlled in position and by volume so that it does not spread into the nearby backside isolation trenches. The rest oxide surfaces are protected from the HF etching by the LPCVD silicon nitride layer on top. After a time-controlled local HF etching, the wafer is quickly and thoroughly rinsed in DI water following by drying. As shown in FIG. 5E, backside isolation trenches 88 are formed and the front side silicon electrodes are exposed at the bottom of the backside through silicon vias (TSV) contact holes 86. In the next step, as shown in FIG. 5F, the backside contact holes are locally metalized (or coated with a suitable electrically conductive material) to form backside contacts 90. In the case of p-type silicon used for the frontside wafer, Al may be used for the TSV contact holes. And in the case of n-type silicon used for the frontside wafer, Ag may be used for the TSV contact holes. Also, other conductive materials such as hastelloy, a nickel-chromium-ion-molybdenum alloy, and/or titanium nitride may be used for their durability under high-temperature and chemically corrosive process environment.

A key to the local metallization process is to apply the metal material into the TSV contacts and make quality contacts to the bottom of the backside contact holes and fully or partially cover their sidewalls all the way through the TSV hole into the bottom of the top wafer to make the connections to the top silicon electrodes. The metallization methods includes aligned screen printing, thermal spraying with a shadow mask, patterning and etching after a blanket coating, inkjet printing, localized dispensing, sputtering with a shadow mask, and other suitable methods. In the case of localized dispensing, metal nano-particles dispersed in a low viscosity liquid is dispensed into the backside contact holes only, with precise volume control so that the liquid does not spread over to short connect the positive and negative contacts. After dispensing, a short vacuum process may be applied to pull the possibly trapped air bubbles out of the deep contact holes. Then a thermal curing, sintering or annealing process is performed to bake out the non-conductive materials and activate the low resistance metal-to-silicon contacts. If necessary, multiple metallization steps may be performed in order to fully cover the bottom and sidewall of the deep backside contact holes. In the last step, a suitable chemical resistant/corrosion resistant coating may be optionally applied to the frontside, edge, and backside surfaces—except the backside contact areas—for improving the MESC survivability in corrosive process environment. However, LPCVD silicon nitride may also serve as a relatively reliable chemical resistant layer over many process cycles and the MESC may then be reconditioned by applying an additional coating of LPCVD silicon nitride to extend MESC's useful life.

Figure 6:
FIG. 6 is fabrication process flow and FIGS. 7A through 7E illustrate X-X cross-sectional schematic drawings after key fabrication steps for the formation of the bipolar MESC of FIGS. 2 and 3.

FIG. 6 is fabrication process flow and FIGS. 7A through 7E illustrate X-X cross-sectional schematic drawings after key fabrication steps for the formation of the bipolar MESC of FIGS. 2 and 3. The structural features depicted in the cross section diagrams of FIGS. 7A through 7E are consistent unless otherwise noted. This fabrication process is similar to that described in FIG. 4 a difference being the isolation trenches and back contact holes are formed by direct laser cutting and drilling.

Figure 7A:
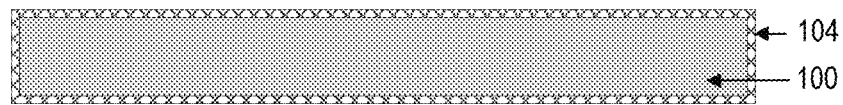

The fabrication process starts with two mono-crystalline silicon wafers each with a thickness preferably in the range of 200 μm to 1 mm and size of 100 mm to 300 mm 9 or larger. The wafers may be n-type or p-type, preferably with relatively low resistivity, such as less than 0.1 Ω·cm. The two wafers may be double-side-polished to suppress leakage current and oxide charging. As shown in FIG. 7A, the two silicon wafers (top wafer 100 and bottom wafer 102) are thermally oxidized with silicon oxide layer (104) 0.5 μm to 3 μm thick. Optionally one of the two wafers may be oxidized while the other is not. A dry-wet-dry oxidation process is optional for improving the oxide quality. Next, the two cleaned wafers are cleaned by standard pre-oxidation wafer cleaning process, including RCA1, RCA2, and short diluted HF dipping followed by extensive DI water rinsing. The cleaned wafers are then brought into contact and to make an initial bonding which may be performed in vacuum, in air, or in DI water. The silicon surfaces to be bonded may be polished to make them flat and smooth. The surfaces are also preferably hydrophobic for the ease of initial bonding. Since the initial bonding is based on Van de Wall's force or the like, it is of low bonding strength. Next, the initially bonded wafer pair is annealed at an elevated temperature about 1000° C., to form a strong chemical bond between the two wafer surfaces. Alternatively, the process may start with a wafer comprised of a top silicon layer and a bottom silicon layer with an underlying silicon dioxide layer positioned between the top and bottom silicon layers.

Figure 7B:
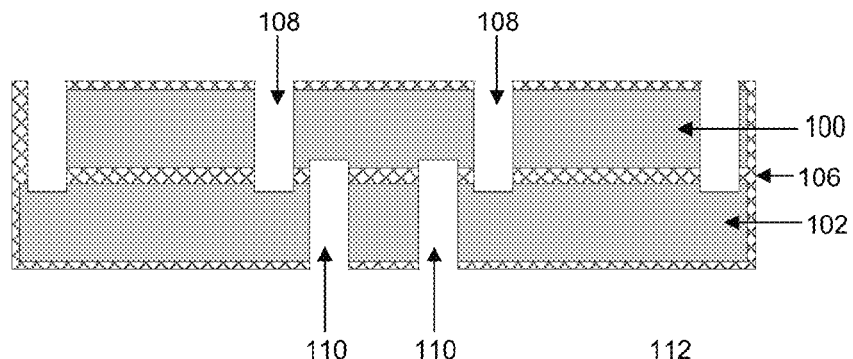

After the fusion bonding of the top and bottom silicon layers with silicon dioxide layer 106 positioned between, as shown in FIG. 7B, frontside isolation trenches 108 and backside isolation trenches 110 are formed by direct laser cutting. The frontside laser cutting goes through the surface nitride and oxide layers, the top bulk silicon layer, the buried oxide layer and a small amount of the bottom bulk silicon layer to form frontside trenches 108. The backside laser cutting is aligned to the front side features and goes through the surface nitride and oxide layers, the bottom bulk silicon layer, the buried oxide layer and a small amount of the top bulk silicon layer to form backside trenches 110. The over cutting shown, which may be in the amount of 5 to 50 μm, after going through the buried oxide layer is ensure that the trench in the top or bottom bulk silicon layer is fully through and creates full isolation of the silicon islands/regions. Alternatively, a laser process with more precise power, energy, and debris removal process control may be applied so that the laser cutting is self-terminated once it reaches the buried oxide layer. After the laser cutting, the wafer is cleaned and slightly etched in a diluted silicon wet etchant, such as a KOH solution, to fully remove the laser cutting debris and reduce the trench sidewall roughness.

Figure 7C:
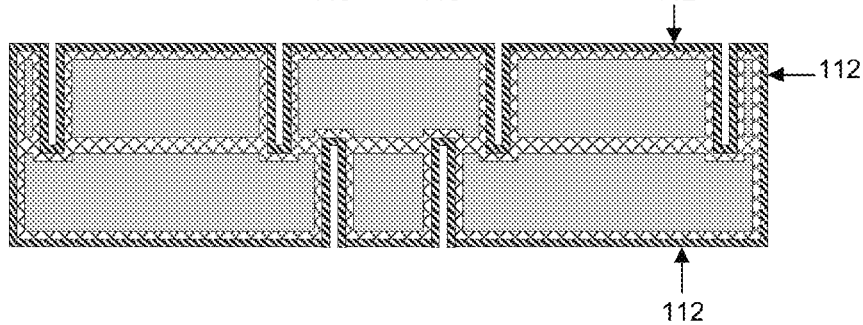
Figure 7D:
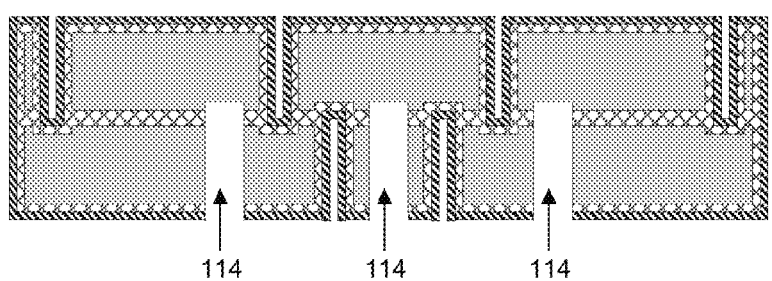

Next, as shown is FIG. 7C, a thermal oxide layer of 0.5 μm to 2 μm thick is grown followed by a LPCVD silicon nitride deposition of 0.1 μm to 3 μm thick to form dielectric layer 112. After this step, all the exposed silicon surfaces, including the trench sidewalls, trench bottom surfaces and wafer edges, are fully covered with the dielectric stack of thermal oxide and LPCVD nitride. Next, as shown in FIG. 7D, backside contact holes 114 are drilled by another laser process. The laser drilling is align to the back and front side trench feature and goes through the backside surface nitride and oxide layers, bottom bulk silicon layer, the buried oxide layer, and a small about of the top bulk silicon layer to form backside contact holes 114. After the laser drilling, a short and diluted KOH and HF etching steps may be performed to fully remove the laser cutting debris and reduce the surface roughness of the drilled backside contact holes.

Figure 7E:
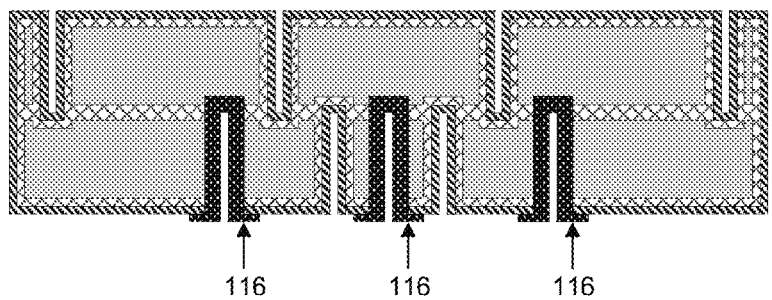

Next, as shown in FIG. 7E, the backside contact holes are locally metalized to form backside contacts 116. In the case of p-type silicon used for the frontside wafer, Al may be used. And in the case of n-type silicon used for the frontside wafer, Ag may be used. Also, conductive materials such as hastelloy, a nickel-chromium-ion-molybdenum alloy, or titanium nitride may be used for in the contacts because of these materials durability in a high-temperature and corrosive process environment. A key to the local metallization process is to forced the metal material into and make quality contacts to the bottom of the backside contact holes and fully or partially cover their sidewalls. The metallization methods include aligned screen printing, thermal spraying with a shadow mask, patterning and etching after a blanket coating, inkjet printing, sputtering using a shadow mask, localized dispensing, and other suitable methods. In the case of localized dispensing, metal nano-particles dispersed in a low viscosity liquid are dispensed into the backside contact holes only, with precise volume control, so that the liquid does not spread over to short connect the positive and negative contacts. After dispensing, a short vacuum process may be applied to pull the possibly trapped air bubbles out of the deep contact holes. Then a thermal curing, sintering or annealing process is performed to bake out the non-conductive materials and activate the low resistance metal-to-silicon contacts. If necessary, multiple metallization steps may be performed in order to fully cover the bottom and sidewall of the deep backside contact holes. Lastly, a suitable chemical resistant/corrosion resistant coating may be optionally applied to the front side, edge and backside surfaces—except the backside contact areas—for improving the MESC survivability in corrosive process environment. LPCVD silicon nitride may also serve as a relatively reliable chemical resistant layer over many process cycles and the MESC may then be reconditioned by applying an additional coating of LPCVD silicon nitride to extend MESC's useful life.

Figure 8A:
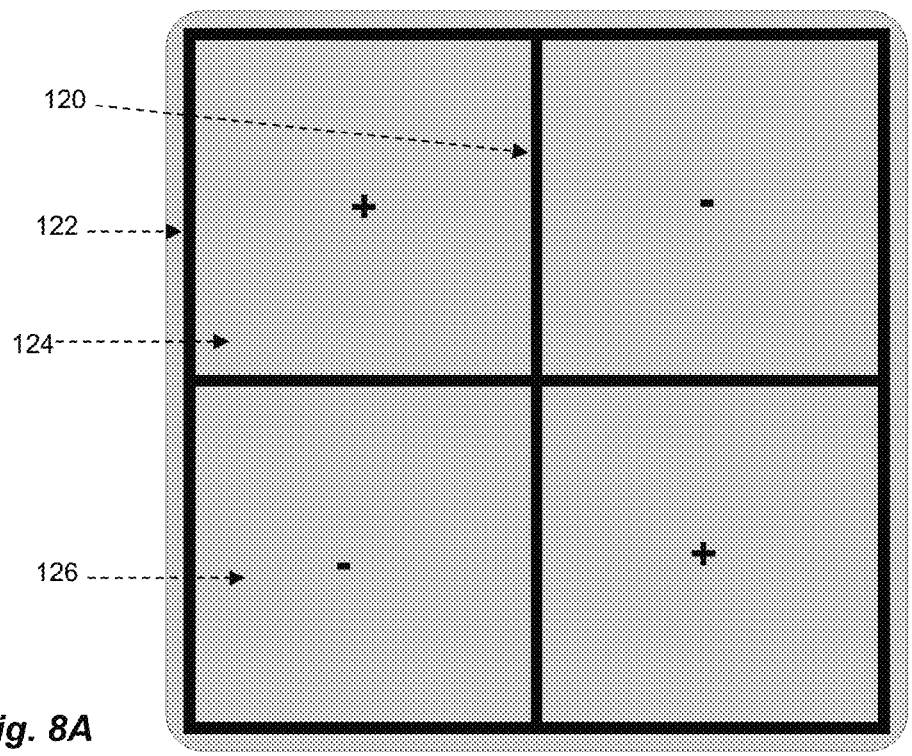
FIGS. 8A and 8B are top and bottom view schematic drawings, respectively, of an embodiment of a bipolar MESC design in accordance with the disclosed subject matter.
Figure 8B:
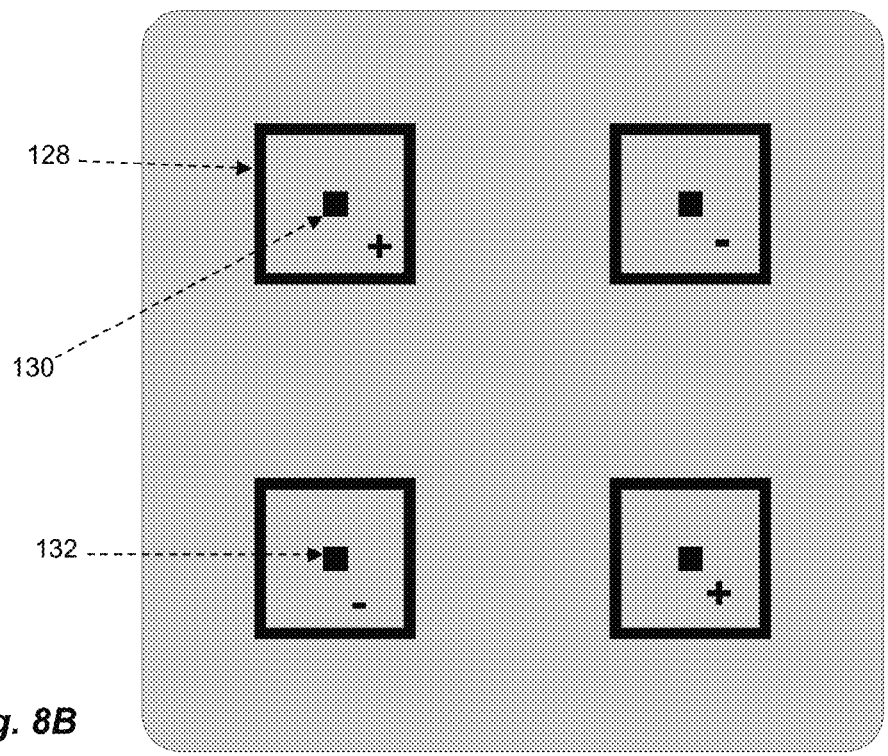

FIGS. 8A and 8B are top and bottom view schematic drawings, respectively, of an embodiment of a bipolar MESC design in accordance with the disclosed subject matter. This dual electrode pair design of a bipolar MESC is also made of two bonded thick layers of mono-crystalline silicon with a buried silicon dioxide layer in between. FIG. 8A shows the front, or top view, of the MESC that consists of two electrode pairs (other designs, patterns, and numbers of pairs of electrodes may be used. The top silicon layer is separated into four isolated regions by frontside isolation trenches 120, including continuous boundary trench 122, with trench bottoms that reach at least to the buried oxide layer. The negative and positive electrodes are evenly and symmetrically arranged with trenches and coated dielectric layers to isolate them from one another, shown as positive electrode region 124 and negative electrode region 126 (alternatively the polarities may be reversed). This distributed arrangement/pattern of electrodes provides uniform electrostatic clamping force that allows the thin wafer to be fully clamped. FIG. 8B shows the backside, or bottom view, of the said MESC. Enclosed backside isolation trenches 128 separate the backside silicon into four isolated regions—each isolated region having an electrical contact hole, such as positive contact hole 130 and negative contact hole 132. The electrical contact holes (which may be TSV holes) are etched through the buried silicon oxide layer between the top and bottom silicon layer to the corresponding positive and negative electrode regions on the top silicon layer. These contact holes are coated or filled with inert metal layers for making direct electrical contact to the front silicon electrodes from the MESC backside. Because every isolated positive or negative electrode is surrounded by electrically floating silicon peripheral regions, the electrodes with same polarity are not physically connected on the MESC, therefore a pair of the backside opposite polarity contacts need to be contacted during the charging and discharging processes.

Figure 9A:
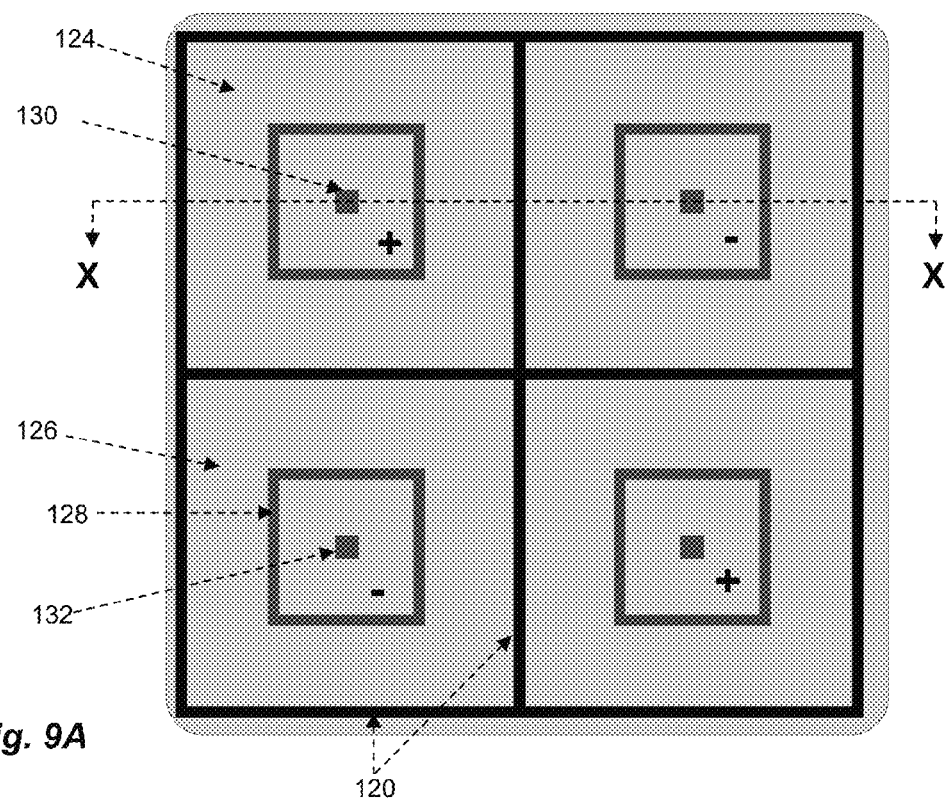
FIG. 9A is a schematic drawing of FIGS. 8A and 8B overlapped together to show the alignment of the frontside and backside features.

FIG. 9A is a schematic drawing of FIGS. 8A and 8B overlapped together to show the alignment of the frontside and backside features: frontside isolation trenches 120 (including boundary trench 122), frontside positive electrode region 124 and frontside negative electrode region 126, backside isolation trenches 128, and backside positive contact hole 130 and backside negative contact hole 132. FIG. 9A illustrates the front and back side trench and contact hole patterns in one overlapped view in order to the corresponding alignment of the frontside and backside features. It can be seen the backside contact regions are aligned to the front side silicon electrodes and to form four separated and identical electrode units.

Figure 9B:
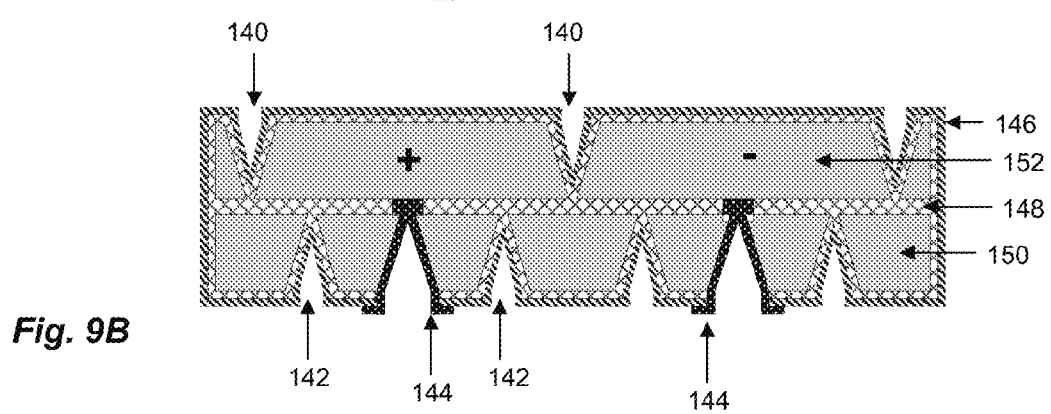
FIG. 9B is a cross sectional diagram of the MESC of FIG. 9A along the X-X cross-sectional plane.

FIG. 9B is a cross sectional diagram of the MESC of FIG. 9A along the X-X cross-sectional plane showing two bonded mono-crystalline silicon wafers (or a SOI wafer). Frontside isolation trenches 140, backside isolation trenches 142, and backside contact holes 144 have tapered sidewalls. Frontside trenches 140 cut through the top silicon wafer and have trench bottoms that terminated at buried silicon oxide layer 148. Top silicon wafer/layer 152 surfaces, including its top surface, side surface, and trench sidewall and bottom surfaces are all covered with a relatively thick thermally grown silicon dioxide layer and an LPCVD silicon nitride layer, dielectric layer 146. As a result, the silicon regions that are separated by the frontside trenches are fully electrically isolated and form isolated silicon electrodes. Backside isolation trenches 142 and metalized backside contact holes 144 are formed on the bottom silicon wafer. Bottom wafer/layer 150 backside surfaces and edge surfaces are also covered by the same thermal oxide and LPCVD nitride layers as the frontside, dielectric layer 146. The backside contact holes (TSV holes) are etched through the backside wafer and through buried silicon oxide layer 148 in order to reach the frontside isolated silicon regions. An electrically conductive and preferably chemical resistant layer, such as a metal or a metallic alloy, is deposited into the backside contact holes to reach all the way to the bottom of the contact holes, including electrical connection to the bottom of the frontside isolated silicon regions. As a result, the frontside isolated silicon electrodes are electrically connected to the isolated contacts on the backside. The backside contact holes may or may not be fully filled by the metal material. The backside isolation trench is formed to isolate the positive and negative backside contact holes and backside isolation trench terminates at the buried oxide layer to eliminate the possibility that the backside silicon electrically connects to the frontside silicon through the backside isolation trenches by particles or electrolyte in the backside isolation trenches.

Figure 10:
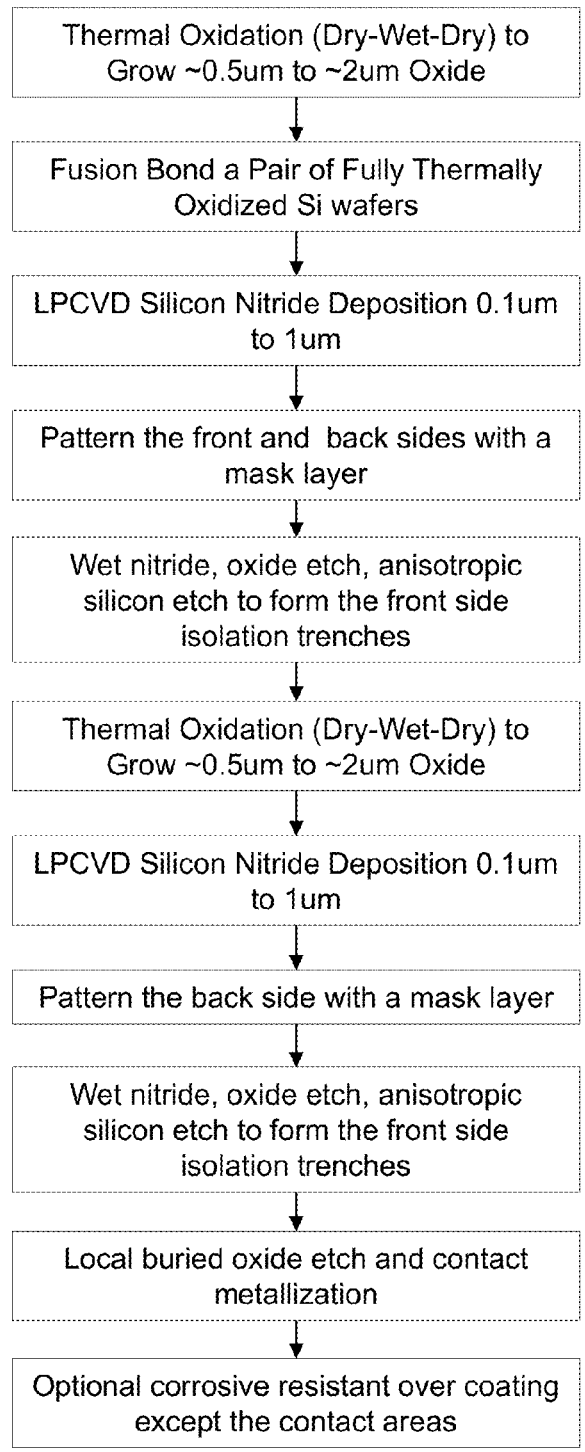
FIG. 10 is fabrication process flow and FIGS. 11A through 11F illustrate X-X cross-sectional schematic drawings after key fabrication steps for the formation of the bipolar MESC of FIGS. 8 and 9.

FIG. 10 is fabrication process flow and FIGS. 11A through 11F illustrate X-X cross-sectional schematic drawings after key fabrication steps for the formation of the bipolar MESC of FIGS. 8 and 9. The structural features depicted in the cross section diagrams of FIGS. 11A through 11F are consistent unless otherwise noted. This fabrication process is similar to that described in FIG. 4 a difference being the isolation trenches and back contact holes are formed by anisotropic silicon etching (such as by using KOH or NaOH solutions).

Figure 11A:
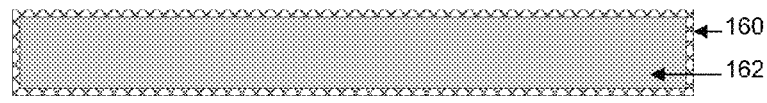

The fabrication process starts with two mono-crystalline silicon wafers, each with a thickness preferably in the range of 200 μm to 1 mm and wafer size (side dimension or diameter) of 100 mm to 300 mm or larger. The wafers may be n-type or p-type, preferably with relatively low resistivity such as less than 0.1 Ω·cm. The two wafers may be double-side-polished to suppress leakage current and oxide charging. As shown in FIG. 11A, the two silicon wafers (shown as top silicon wafer 160 and bottom silicon wafer 164) are thermally oxidized with silicon oxide layer 160 which may be 0.5 μm to 3 μm thick. Optionally one of the two wafers may be oxidized while the other is not. A dry-wet-dry oxidation process may be used to improve the oxide quality. First, the two cleaned wafers are cleaned by standard pre-oxidation wafer cleaning process, including RCA1 (SC1), RCA2 (SC2), and short diluted HF dipping followed by extensive DI water rinsing. The cleaned wafers are then brought into contact to make an initial bonding which may be performed in vacuum, in air, or in DI water. The silicon surfaces to be bonded are preferably polished to make them flat and smooth. The surfaces are also preferably hydrophobic for the ease of initial bonding. Because the initial bonding is based on Van de Wall's force or the like, it is of low bonding strength. In the next step, the initially bonded wafer pair is annealed at an elevated temperature about 1000° C., to form a strong chemical bond between the two wafer surfaces.

Figure 11B:
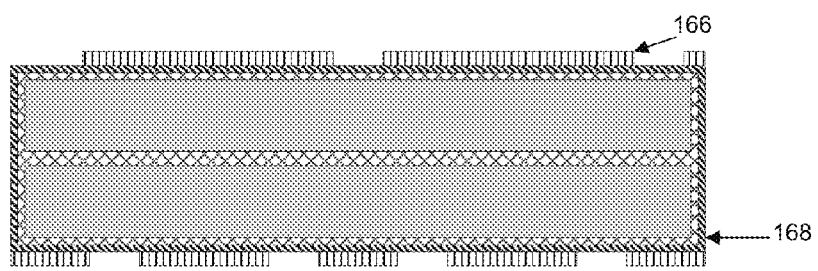
Figure 11C:
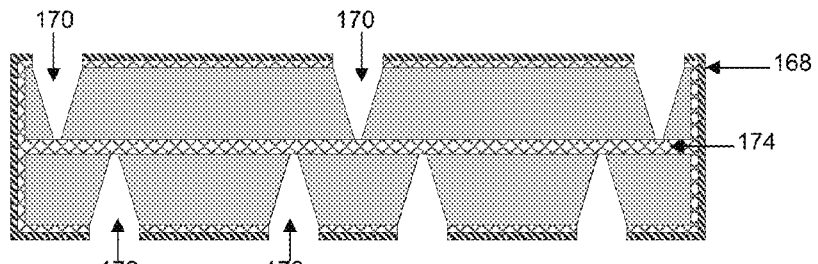

After the fusion bonding, patterned masking layers are made on top of the front and back surface of the bonded wafer with proper alignment for conducting the subsequent oxide patterning and silicon trench etching. The patterned masking layer may be a photolithographically defined photoresist layer or a screen printed making layer. Alternatively, an oxide etch paste layer may be screen printed and sintered for etching the underneath oxide. FIG. 11B shows the bonded wafers with fully covered thermal oxide layers 168 (such as LPCVD $SiN_x$) and the patterned masking layers on its top and bottom surfaces, patterned masking layer 166. Next, the lateral pattern of the masking layers is transferred onto the underneath silicon dioxide layers by a buffered HF (BOE) oxide etching step. The edge oxide surface is protected in the BOE oxide etching step. After the oxide etching, the remaining masking layer is removed and the wafer is cleaned. Next, as shown is FIG. 11C, an anisotropic silicon etching process, such as KOH or NaOH, is used to etch the frontside silicon trenches 170 and backside silicon trenches 172. The trench width is in the range of 20 μm to 100 μm and the depth is in the range of 10 μm to 500 μm. The sidewall tapering has an angle of 54.7° that is defined by (100) and (111) silicon crystallographic planes. The silicon etching is self-terminated at the buried/underlying silicon dioxide layer 174. The sidewalls of the trenches are (111) crystallographic silicon planes and thus are extremely smooth.

Figure 11D:
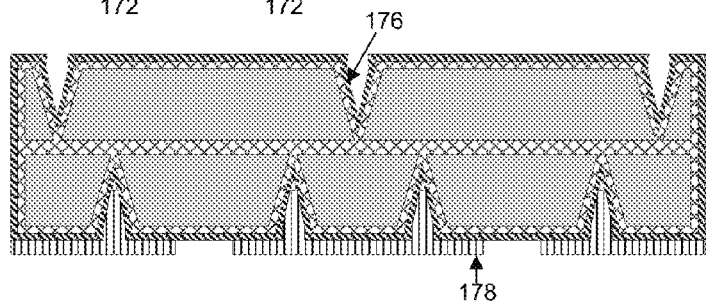
Figure 11E:
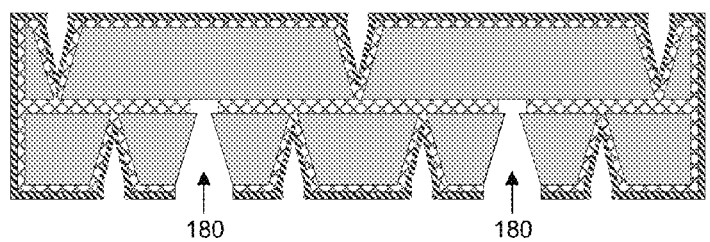

Next, as shown is FIG. 11D, a thermal oxide layer of 0.5 μm to 2 μm thick is grown followed by a LPCVD silicon nitride deposition of 0.1 μm to 3 μm thick, layer 176. After this step, all the exposed silicon surfaces, including the trench sidewalls and wafer edges, are fully covered with the dielectric stack of thermal oxide and LPCVD nitride. Next, the backside LPCVD silicon nitride layer is optionally fully removed in a single-side chemical etching or mechanical lapping process. A patterned masking layer, 178, is then applied on the backside by photolithographically defined photoresist that is spray-coated to cover the surfaces of backside trenches. Alternatively, a nitride and oxide etch paste layer may be screen printed and sintered for etching the underneath oxide and nitride layers. The backside patterning is for opening the backside contact holes and is aligned to the front and backside trench patterns (etched features) with front and backside alignment marks. FIG. 11D shows the oxide and nitride coated trenches, 176, and photolithographically-defined backside contact hole patterns. After a subsequent silicon nitride and oxide wet etching, another KOH silicon etching process is performed to form the backside contact holes. The backside silicon etching is self-terminated when it reaches the buried oxide layer. Next, a selective buried silicon oxide etching is performed by dispensing HF based wet etchant into the etched backside contact holes only. The dispensing of the HF based wet etchant is precisely controlled in position and by volume so that it does not spread into the nearby backside isolation trenches. The rest of the oxide surfaces may be protected from the HF etching by the LPCVD silicon nitride layer on top. After a time-controlled local HF etching, the wafer is quickly and thoroughly rinsed in DI water following by drying. As shown in FIG. 11E, backside contact holes 180 are formed exposing the front side silicon electrodes at the bottom of the backside contact holes.

Figure 11F:
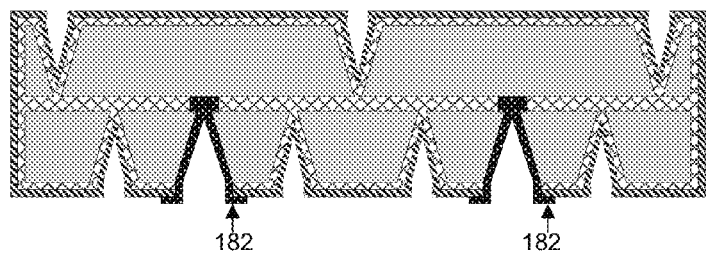

Next, as shown in FIG. 11F, the backside contact holes are locally metalized to form backside contacts 182. In the case p-type silicon is used for the frontside wafer, Al may be used. In the case n-type silicon is used for the frontside wafer, Ag may be used. Also, conductive materials such as hastelloy, a nickel-chromium-ion-molybdenum alloy, or titanium nitride may be used for their durability in high-temperature and corrosive process environments. A key to the local metallization process is to apply the metal material into the TSV contact holes and make quality contacts to the bottom of the backside contact holes and fully or partially cover the contact sidewalls. The metallization methods includes aligned screen printing, sputtering using a shadow mask, thermal spraying with a shadow mask, patterning and etching after a blanket coating, inkjet printing, localized dispensing, and other suitable methods. In the case of localized dispensing, metal nano-particles dispersed in a low viscosity liquid is dispensed into the backside contact holes only, with precise volume control, so that the liquid does not spread over to short connect the positive and negative contacts. After dispensing, a short vacuum process may be applied to pull the possibly trapped air bubbles out of the deep contact holes. Then a thermal curing, sintering or annealing process is performed to bake out the non-conductive materials and activate the low resistance metal-to-silicon contacts. If necessary, multiple metallization steps may be performed in order to fully cover the bottom and sidewall of the deep backside contact holes. In the last step, a suitable corrosion resistant coating may be optionally applied to the front side, edge, and backside surfaces—except the backside contact areas—to improving the MESC survivability in corrosive process environments. LPCVD silicon nitride may also serve as a relatively reliable chemical resistant layer over many process cycles and the MESC may then be reconditioned by applying an additional coating of LPCVD silicon nitride to extend MESC's useful life.

Other considerations include the clamping force of the MESC. A combination of capacitor electrode (polished monocrystalline Si) and dielectric (Thermal $SiO_2$+LPCVD $Si_3N_4$+Thermal SiO2) to strongly suppress DC charging of dielectric stack or interface (very high barrier) is suggested. Further, use polished crystalline silicon wafer to minimize injection probability and hydrophobic, oleophobic, or non-stick surface. Minimize carrier injection probability by maintaining the thermal silicon dioxide electric field <0.1 MV/cm or <10 V/μm.

The clamping force per unit area for an MESC with total voltage V across the electrodes spaced apart by "d" and equal areas for frontside positive and frontside negative electrodes:

$$F=[\in \cdot (V/2)2]/(2 \cdot d2)$$

$$F=(\in \cdot V2)/(8 \cdot d2)$$

For instance, the clamping force per unit area of a thin wafer for MESC with 2 μm thick layer of $SiO_2$ ($\in OX$=3.9), 0.5 μm $Si_3N_4$ ($\in N$=7.5), 12.5 μm TUFRAM ($\in T$=2.1), and V=100 V is as follows:

$$\in eff=2.3 \in 0 \ \backslash F=(2.3 \times 8.854 \times 10-12 F/m \times 104 V2)/[8 \times (15 \times 10-6m)2]$$

$$F=109.1 \ N/m2 \ for \ V=100 \ V$$

For V=50 V, the clamp force would be F=27.28 N/m2. Note that weight of 25 μm thick Si wafer per m2 is:

$$W=(25 \times 10-6 \ m) \times 2.33 \ g/cm3 \times 106 \ cm3/m3 \times 0.00981 \ N/g=0.571 \ N/m2$$

Thus, for V=100 V, the MESC clamp force may be 191× a thin wafer weight.

In operation, to ensure repeatable and consistent declamping: limit the MESC electric field value to <10 V/μm (this is 1/100 of the thermal oxide dielectric breakdown field) to essentially eliminate dielectric charging. For a 15 μm thick dielectric stack (oxide+nitride+TUFRAM), this translates to a maximum clamping voltage of 150 V and a clamping force ~430 times a thin wafer weight (for 25 μm thick wafer).

For consistent, rapid (<1 sec) declamping: limit the clamp electric field to <10 V/μm or <0.1 MV/cm; discharge the capacitor, then apply a voltage pulse of opposite polarity with an optimal peak voltage larger than the clamp voltage (all in <1 sec using an automated charge/discharge/declamp unit); and apply a short ultrasonic energy pulse from MESC backside to declamp/dislodge the thin wafer.

In operation, key structural features made into bulk silicon in the bipolar MESCs disclosed include: front isolation trenches (including boundary trench), back isolation trenches, and back contact holes. In operation, key structural fabrication methods disclosed include: DRIE silicon etch, laser cutting/drilling, and wet silicon etch. It is important to note that the structural features of the disclosed MESC may be formed by any combination of fabrication methods. For example, in one MESC design, the frontside trenches may be formed by the DRIE etching to have narrower and deep trenches while the backside trench and holes may be formed by direct laser cutting/drilling for reduced fabrication cost. Further, the MESC structures and methods are not limited to those disclosed and other combinational selections of the methods and structures are within the scope of the present invention. Additionally, it is also to be noted that the number of electrode pairs and the electrode design of the MESC is not limited to the patterns disclosed, but rather additional designs are within the scope of the disclosed subject matter.

The disclosed MESC structures and designs may be used to carry and support thin wafers to be processed in conventional manufacturing equipment and setups. For example, a MESC carried thin wafer may be insert into a wafer cassette for wet chemical processing. The wafer cassette may have conventional or slightly wider slot openings. Also, a MESC carried thin wafer may be directly placed on top of a tray or a conveyer of a conventional batch/in-line manufacture tool, such as vacuum PECVD silicon nitride anti-reflection coating (ARC) deposition. FIG. 12 shows an embodiment of a multiple-MESC tray.

Figure 12A:
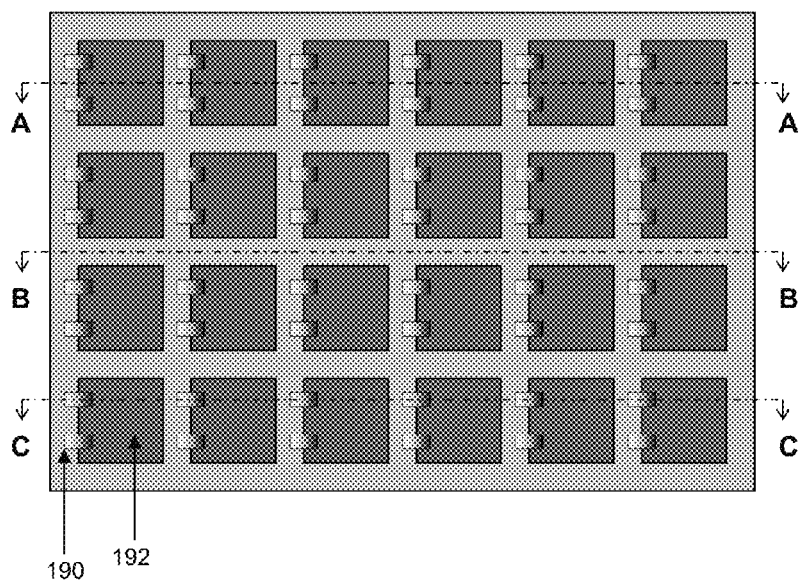
FIG. 12A is a top view schematic drawing of an embodiment of a bipolar MESC tray design in accordance with the disclosed subject matter and FIGS. 12B, 12C, and 12D are cross sectional diagrams of the MESC tray of FIG. 12A.
Figure 12B:
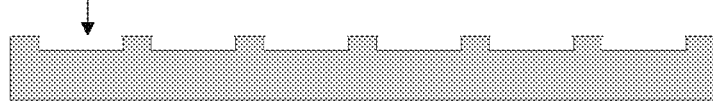
Figure 12C:
Figure 12D:
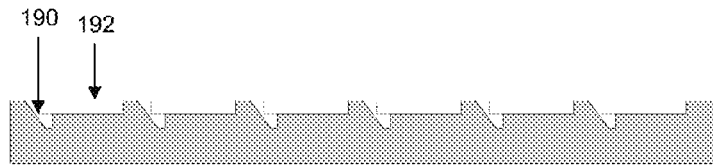

FIG. 12A is a top view schematic drawing of an embodiment of a bipolar MESC tray design in accordance with the disclosed subject matter. FIGS. 12B, 12C, and 12D are cross sectional diagrams of the MESC tray of FIG. 12A along the A-A, B-B, and C-C planes depicted in FIG. 12A. The structural features depicted in the cross section diagrams of FIGS. 12B, 12C, and 12D are consistent unless otherwise noted. The top and cross-sectional views in FIG. 12 illustrate an MESC tray for enabling carrying/support of multiple thin wafers in a batch or a hybrid batch/in-line manufacturing process. FIG. 12A illustrates the top view of a 4×6 MESC tray, which has 24 nested positions/recesses, such as recess 192, for single-wafer MESC carriers and handler end effector access points, such as access 190. The size of each MESC recess is slightly larger than a MESC—for example, if a MESC is 160 mm×160 mm, the tray recess may be in the range around 170 mm×170 mm. The depth of the recess, such as recess 194 in FIG. 12B, is on the order of the single-wafer MESC (such as in the range of 0.5 mm to 2 mm). And the space between adjacent MESC recesses may be in the range of 5 mm to 20 mm. The thickness of the MESC tray may be in the range of 2 mm to 20 mm, preferably around 5 mm. The tray optionally may have through holes at the center of each MESC recess to allow for charge and discharge of each MESC on the tray (through holes not shown in FIG. 12). Additionally, shallow and tapered slots (shown as 190 in FIGS. 12A and 12D) are made at the edge of each MESC recess for MESC handler end effector access to each MESC backside for loading and unloading. The tray may be made of conventional materials that are used to make trays or conveyers of batch/in-line processing equipment. As an example, the tray may be made of aluminum that is anodized and/or coated with a thin layer of heat and chemical resistant material, such as TFLON.

The foregoing description of the preferred embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein. It is intended that all such additional systems, methods, features, and advantages that are included in this description be within the scope of the claims.

What is claimed is:

1. A bipolar mobile electrostatic carrier for wafer processing, comprising:
   a top crystalline semiconductor layer having isolated positive electrode regions and isolated negative electrode regions;
   a frontside trench through said top crystalline semiconductor layer extending at least to an underlying insulating layer, said frontside trench separating said negative electrode regions and said positive electrode regions;
   said insulating layer positioned between said top crystalline semiconductor layer and a bottom crystalline semiconductor layer;
   a dielectric layer covering exposed surface areas of said top crystalline semiconductor layer and surface areas of said insulating layer exposed by said frontside trench;
   said bottom crystalline semiconductor layer having a backside trench through said bottom crystalline semiconductor layer extending at least to said insulating layer, said backside trench forming isolated backside regions on the bottom surface of said bottom crystalline semiconductor layer aligned to said negative electrode regions and said positive electrode regions on said top crystalline semiconductor layer; and
   backside contacts on said isolated backside regions, said backside contacts coupled to said positive electrode regions and said negative electrode regions, said backside contacts for charging said positive electrode regions and said negative electrode regions.

2. The bipolar mobile electrostatic carrier of claim 1, wherein said insulating layer is a silicon dioxide layer.

3. The bipolar mobile electrostatic carrier of claim 1, wherein said insulating layer is a thermally grown silicon dioxide layer.

4. The bipolar mobile electrostatic carrier of claim 1, wherein said dielectric layer is a dielectric stack layer comprising a silicon dioxide layer and a silicon nitride layer.

5. The bipolar mobile electrostatic carrier of claim 1, wherein said dielectric layer is a dielectric stack layer comprising a thermally grown silicon dioxide layer and a low-pressure chemical-vapor-deposited (LPCVD) silicon nitride layer.

6. The bipolar mobile electrostatic carrier of claim 1, wherein said top crystalline semiconductor layer and said bottom crystalline semiconductor layer are crystalline silicon layers.

7. The bipolar mobile electrostatic carrier of claim 6, wherein said top crystalline semiconductor layer and said bottom crystalline semiconductor layer are mono-crystalline or polycrystalline silicon layers or silicon layers.

8. The bipolar mobile electrostatic carrier of claim 1, wherein said frontside trench is formed in a hub and spoke design.

9. The bipolar mobile electrostatic carrier of claim 1, wherein said frontside trench forms dual pairs of isolated positive electrode regions and isolated negative electrode regions.

10. The bipolar mobile electrostatic carrier of claim 1, wherein said bipolar mobile electrostatic carrier is arranged on a tray for batch wafer processing.

11. The bipolar mobile electrostatic carrier of claim 1, wherein said bipolar mobile electrostatic carrier is for thin wafer processing, said thin wafer having a thickness in the range of 1 μm to 100 μm.

12. A method for fabricating a bipolar mobile electrostatic carrier for wafer processing, comprising the steps of:
   forming a frontside trench in the top surface of a semiconductor substrate extending at least to a buried insulating layer, said frontside trench forming isolated frontside regions in said top surface of said semiconductor substrate;
   depositing a dielectric layer on all exposed surfaces of said semiconductor substrate and surface areas of said insulating layer exposed by said frontside trench;
   forming a backside trench in the bottom surface of said semiconductor substrate extending at least to said buried insulating layer, said backside trench forming isolated backside regions on said bottom surface of said semiconductor substrate aligned to said isolated regions on said top surface of said substrate; and
   forming backside contact holes in said isolated backside regions on said bottom surface to said isolated frontside regions, said backside contact holes aligned to said isolated frontside regions to form backside contacts coupled to said isolated regions on said top surface of said semiconductor substrate.

13. The method for fabricating the bipolar mobile electrostatic carrier of claim 12, wherein said semiconductor substrate is a silicon-on-insulator semiconductor substrate.

14. The method for fabricating the bipolar mobile electrostatic carrier of claim 12, wherein said semiconductor substrate comprises a top semiconductor substrate bonded to a bottom semiconductor substrate and an insulating layer positioned between said top semiconductor substrate and said bottom semiconductor substrate.

15. The method for fabricating the bipolar mobile electrostatic carrier of claim 12, further comprising the steps for forming said semiconductor substrate, the steps comprising:
    forming an insulating layer on a first semiconductor wafer; and
    bonding said first semiconductor wafer to a second semiconductor wafer.

16. The method for fabricating the bipolar mobile electrostatic carrier of claim 12, wherein said frontside trench, said backside trench, and said backside contact holes are formed according to a deep reactive ion etch process.

17. The method for fabricating the bipolar mobile electrostatic carrier of claim 12, wherein said frontside trench, said backside trench, and said backside contact holes are formed according to a laser drilling process.

18. The method for fabricating the bipolar mobile electrostatic carrier of claim 12, wherein said frontside trench, said backside trench, and said backside contact holes are formed according to an anisotropic etch process.

19. The method for fabricating the bipolar mobile electrostatic carrier of claim 12, wherein said frontside trench forms dual pairs of isolated positive electrode regions and isolated negative electrode regions.

20. A bipolar mobile electrostatic carrier for semiconductor wafer support and/or processing, comprising:
    a top electrically conductive semiconductor layer having isolated positive electrode regions and isolated negative electrode regions;
    a frontside trench through said top electrically conductive semiconductor layer extended to at least one underlying insulating layer, said frontside trench separating said negative electrode regions and said positive electrode regions;
    said insulating layer positioned between said top electrically conductive semiconductor layer and a bottom electrically conductive semiconductor layer;
    a dielectric layer covering exposed surface areas of said top electrically conductive semiconductor layer and surface areas of said insulating layer exposed by said frontside trench;
    said bottom electrically conductive semiconductor layer having a backside trench through said bottom electrically conductive semiconductor layer extended to at least said insulating layer, said backside trench forming isolated backside regions on the bottom surface of said bottom electrically conductive semiconductor layer aligned to said negative electrode regions and said positive electrode regions on said top electrically conductive semiconductor layer; and
    backside contacts on said isolated backside regions, said backside contacts coupled to said positive electrode regions and said negative electrode regions, said backside contacts for electrically charging said positive electrode regions and said negative electrode regions.

* * * * *